US 6,692,326 B2

(12) United States Patent
Choi et al.

(10) Patent No.: US 6,692,326 B2
(45) Date of Patent: Feb. 17, 2004

(54) METHOD OF MAKING ORGANIC ELECTROLUMINESCENT DISPLAY

(75) Inventors: Do-hyun Choi, Seoul (KR); Kyung-hee Choi, Seoul (KR)

(73) Assignee: CLD, Inc., Seoul (KR)

( * ) Notice: Subject to any disclaimer, the term of this patent is extended or adjusted under 35 U.S.C. 154(b) by 0 days.

(21) Appl. No.: 09/985,142

(22) Filed: Nov. 1, 2001

(65) Prior Publication Data

US 2003/0003225 A1 Jan. 2, 2003

(30) Foreign Application Priority Data

| Jun. 16, 2001 | (KR) | 2001-34193 |
| Aug. 16, 2001 | (KR) | 2001-49414 |
| Sep. 18, 2001 | (KR) | 2001-57741 |

(51) Int. Cl.[7] .............. H01J 9/00; B05D 5/12
(52) U.S. Cl. .............. 445/24; 445/25; 427/66
(58) Field of Search .............. 445/23, 24, 25; 313/512, 506; 427/66, 554, 596; 438/958

(56) References Cited

U.S. PATENT DOCUMENTS

| 5,684,365 A | * 11/1997 | Tang et al. .............. 313/506 |
| 5,686,360 A | 11/1997 | Harvey, III et al. |
| 5,757,126 A | 5/1998 | Harvey, III et al. |
| 5,771,562 A | 6/1998 | Harvey, III et al. |
| 5,811,177 A | 9/1998 | Shi et al. |
| 5,821,692 A | 10/1998 | Rogers et al. |
| 5,855,994 A | 1/1999 | Biebuyck et al. |
| 5,952,778 A | * 9/1999 | Haskal et al. .............. 313/504 |
| 6,075,317 A | * 6/2000 | Keyser et al. .............. 313/506 |
| 6,080,031 A | 6/2000 | Rogers et al. |
| 6,103,541 A | 8/2000 | Yang et al. |
| 6,111,357 A | * 8/2000 | Fleming et al. .............. 313/509 |
| 6,121,726 A | * 9/2000 | Codama et al. .............. 313/504 |
| 6,144,157 A | 11/2000 | Rogers et al. |
| 6,146,225 A | 11/2000 | Sheats et al. |
| 6,198,217 B1 | * 3/2001 | Suzuki et al. .............. 313/506 |
| 6,226,890 B1 | * 5/2001 | Boroson et al. .............. 427/294 |
| 6,242,116 B1 | * 6/2001 | Tadashi et al. .............. 313/506 |
| 6,302,756 B1 | * 10/2001 | Ootsuki et al. .............. 445/24 |
| 6,416,888 B1 | * 7/2002 | Kawamura et al. .............. 313/506 |
| 6,524,877 B1 | * 2/2003 | Nakazawa et al. .............. 438/48 |

* cited by examiner

*Primary Examiner*—Dean A. Reichard
*Assistant Examiner*—Angel R. Estrada
(74) *Attorney, Agent, or Firm*—Birch, Stewart, Kolasch & Birch, LLP

(57) ABSTRACT

Disclosed is a method of fabricating an organic electroluminescent display enabling to improve device characteristics and reliability by performing excimer laser annealing on a passivation layer locally. The present invention includes forming an anode layer, an organic electroluminescent layer, and a cathode layer successively on a transparent substrate, forming a passivation layer on the transparent substrate including the cathode layer, and performing heat treatment on the passivation layer locally.

13 Claims, 7 Drawing Sheets

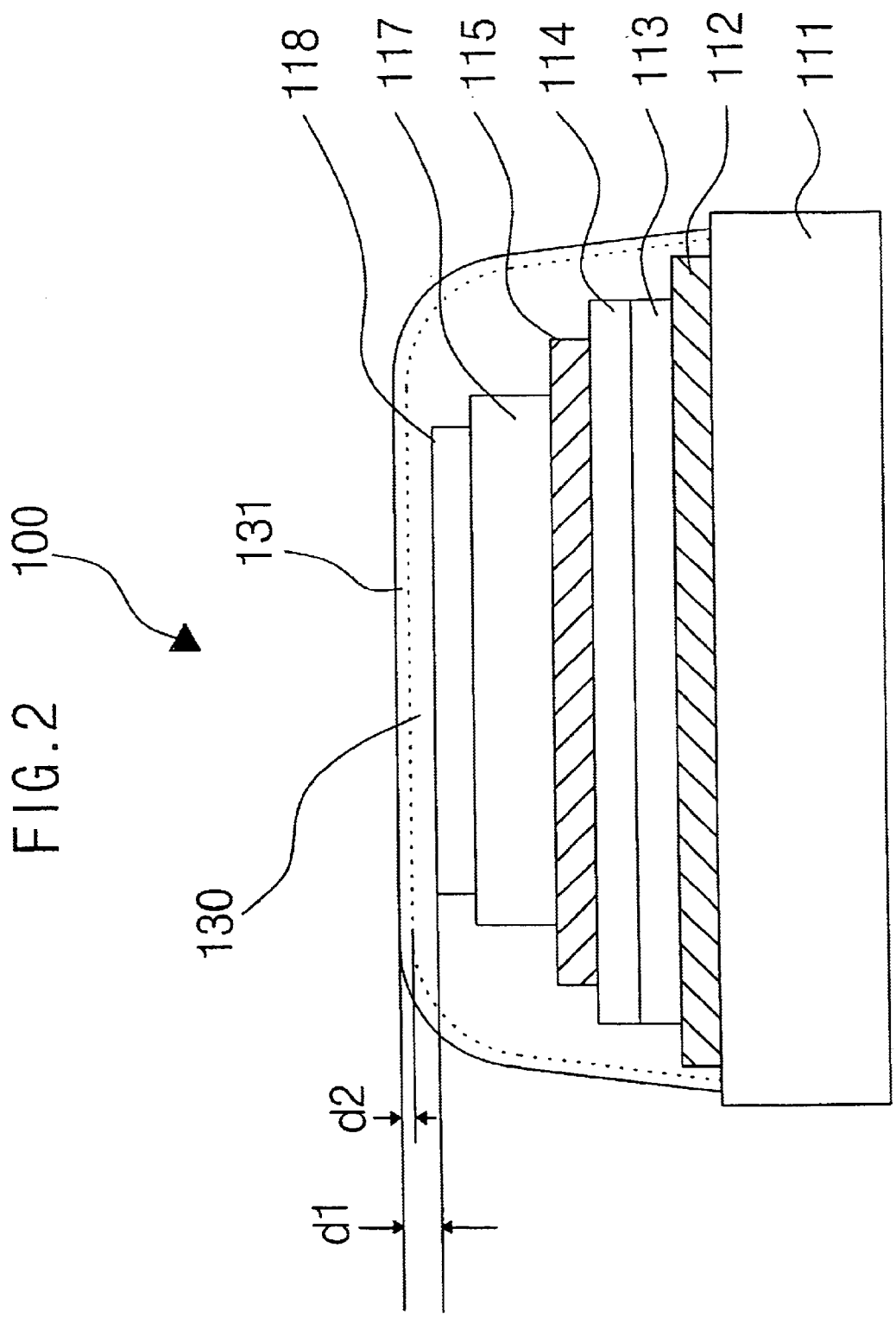

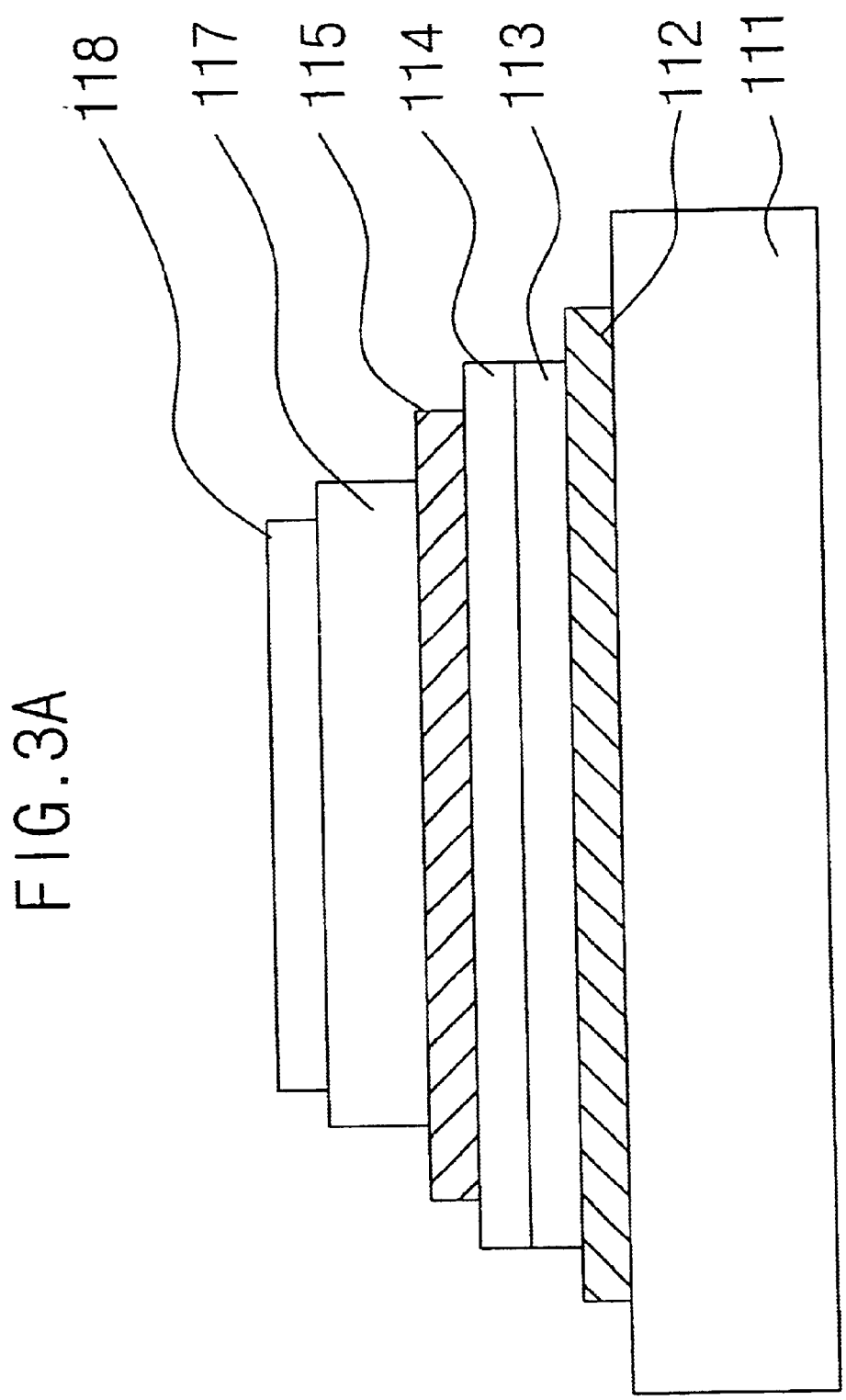

METHOD OF MAKING ORGANIC ELECTROLUMINESCENT DISPLAY

BACKGROUND OF THE INVENTION

1. Field of the Invention

The present invention relates to a method of fabricating an organic electroluminescent display(hereinafter abbreviated OELD) enabling to improve device characteristics and reliability by performing excimer laser annealing on a passivation layer without affecting any other elements of the device.

2. Background of the Related Art

As information communication technology is greatly developed, demands for electronic displaying means are highly increased in accordance with a variety of information societies. So does the demand for various displays. In order to meet the demands of the information society, for electronic display devices are required characteristics such as high-resolution, large-size, low-cost, high-performance, slim-dimension, and small-size and the like, for which new flat panel display(FPD) is developed as a substitution for the conventional cathode ray tube(CRT).

In the presently developed or used flat panel displays, there are Liquid Crystal Display(LCD), Light Emitting Display(LED), Plasma Display Panel(PDP), Vacuum Fluorescence Display(VFD), Electroluminescent Display(ELD) and the like.

Compared to the non-emissive device, ELD (electroluminescent display) attracts attention as a flat panel display having characteristics such as a response time faster than that of the non-emissive device such as LCD, an excellent brightness due to self-emission, an easy fabrication from a simple structure, and a light weight/slim design. ELD is applied to a new flat panel display (FPD) as a next-generation substitute. ELD is generally divided into two categories, i.e. an organic electroluminescent display (hereinafter abbreviated OELD) and an inorganic electroluminescent display (hereinafter abbreviated IELD) in accordance with materials used for luminescent layers.

In the above-mentioned OELD, a conductive transparent anode layer, a hole injection layer, a hole transport layer, an organic electroluminescent layer, an electron transport layer, and a cathode layer are stacked successively on a transparent substrate formed of glass, quartz or the like. In this case, an organic material constructing the organic electroluminescent layer is very sensitive to oxidation, moisture, and contamination due to impurities, thereby needing an airtight passivation layer. Specifically, the cathode layer is formed of a metal having a low work function in order to reduce a driving voltage and achieve efficient electron injection. Such a metal is very sensitive to external oxygen and moisture. Namely, the oxidation of the metal constructing the cathode layer degrades luminescent characteristics of the device such as luminescent brightness, uniformity of luminescence and the like badly, thereby reducing the life-time of OELD.

Moreover, when defects such as pinholes and the like exist in a metal surface of the cathode layer, oxygen, moisture and the like penetrate into the organic electroluminescent layer through these pinholes so as to degrade the organic electroluminescent layer. Therefore, the device characteristics are abruptly degraded. In order to secure the reliability of QELD, the organic electroluminescent layer as well as the pinholes in the cathode layer should be cut off from an ambient atmosphere so as to prevent the degradation.

One of the methods for shielding the organic electroluminescent layer of OELD from an external environment is using a metal cap.

FIG. 1 illustrates a cross-sectional view of an OELD using a metal cap according to a related art.

Referring to FIG. 1, an OELD 10 using a metal cap 20 is fabricated in a manner that an anode layer 12 formed of a conductive transparent material is stacked on a transparent substrate 11. And, on the anode layer 12 successively stacked are a hole injection layer 13, a hole transport layer 14, an organic electroluminescent layer 15, an electron transport layer 17, and a cathode layer 18. The anode, hole injection, hole transport, organic electroluminescent, electron transport, and cathode layers 12, 13, 14, 15, 17, and 18 stacked on the transparent substrate 11 are sealed using a metal cap 20 having a desiccant 19 at a center inside and a sealant 21.

In the OELD 10 having the above-constructed metal cap 20, when a voltage is applied between the anode layer 12 and the cathode layer 18, holes move from the anode layer 12 into the organic electroluminescent layer 15 through the hole injection layer 13 and hole transport layer 14 while electrons move from the cathode layer 18 into the organic electroluminescent layer 15 through the electron transport layer 17. Thus, the organic electroluminescent layer 15, where the injected holes are combined with the injected electrons to generate the emission of light, emits lights. In this case, the hole injection, hole transport, and electron transport layers 13, 14, and 17 play an auxiliary role in increasing an efficient luminescence of OELD.

Unfortunately, the metal cap having the desiccant is left apart from a surface of the cathode layer in the related art. When the metal cap fails to secure 100% sealing by the sealant, the organic electroluminescent and cathode layers become contacted with oxygen and moisture so as to cause the degradation. Thus, it is difficult to protect the device completely only with the desiccant existing in part. Moreover, steps of attaching the desiccant and metal cap to the CELD are very complicated.

SUMMARY OF THE INVENTION

Accordingly, the present invention is directed to a method of fabricating an organic electroluminescent display that substantially obviates one or more of the problems due to limitations and disadvantages of the related art.

An object of the present invention is to provide a method of fabricating an organic electroluminescent display (hereinafter abbreviated OELD) enabling to improve device characteristics and reliability by preventing organic electroluminescent and cathode layers from being contacted with oxygen, moisture and the like.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a method of fabricating an organic electroluminescent display according to the present invention includes the steps of forming an anode layer, an organic electroluminescent layer, and a cathode layer successively on a transparent substrate, forming a passivation layer on the transparent substrate including the cathode layer, and performing local heat treatment on the passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 illustrates a cross-sectional view of an OELD according to the present invention;

FIG. 3A to FIG. 3C illustrate cross-sectional views of fabricating an OELD according to the present invention.

DETAILED DESCRIPTION OF THE PREFERRED EMBODIMENTS

Figure 1:
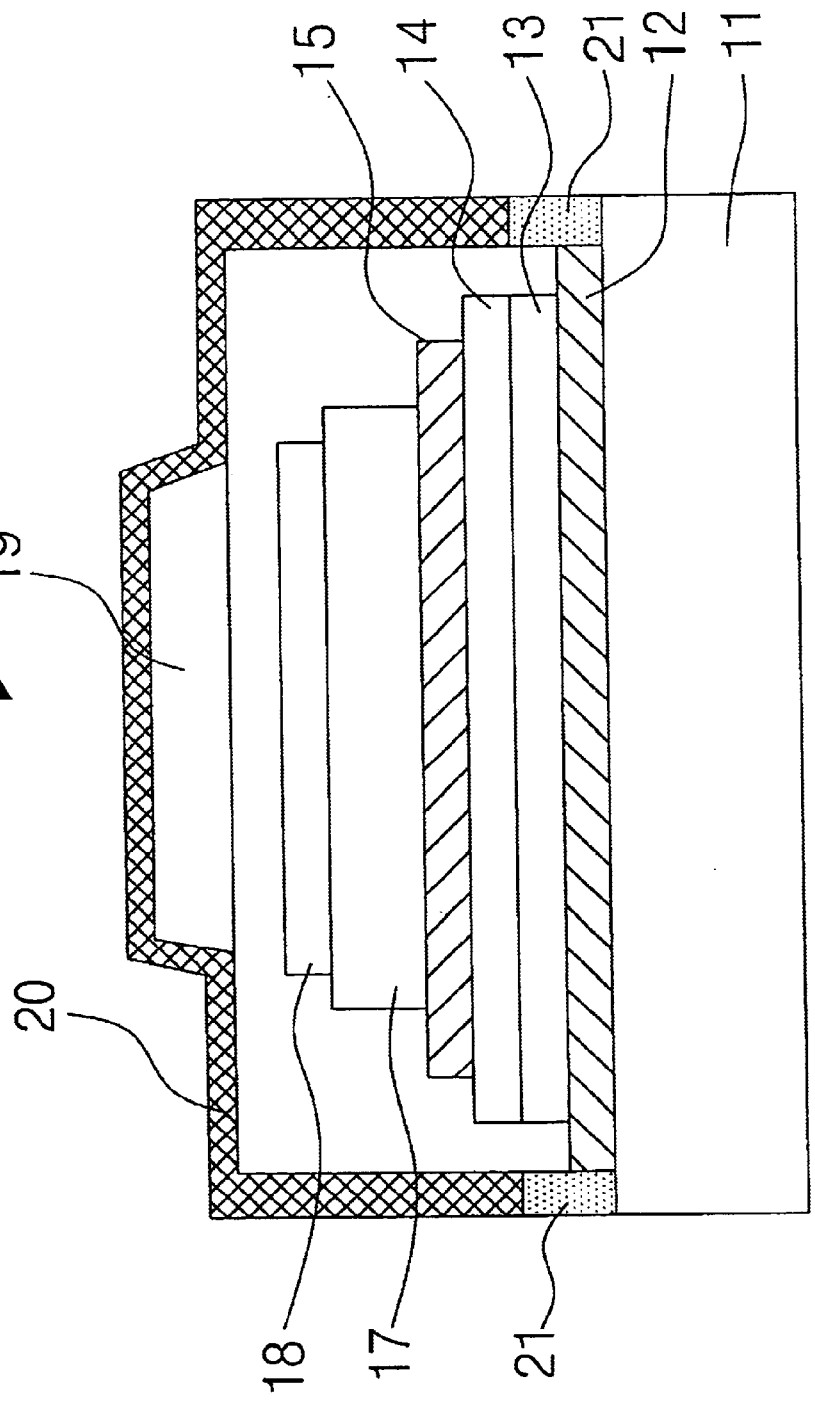
FIG. 1 illustrates a cross-sectional view of an OELD according to a related art.

Reference will now be made in detail to the preferred embodiments of the present invention, examples of which are illustrated in the E accompanying drawings. Where possible, the same reference numerals will be used to illustrate like elements throughout the specification.

FIG. 2 illustrates a cross-sectional view of an OELD according to the present invention.

Referring to FIG. 2, an OELD 100 having a thin passivation layer according to the present invention is fabricated in a manner that an anode layer 112, a hole injection layer 113, a hole transport layer 114, an organic electroluminescent layer 115, an electron transport layer 117, and a cathode layer 118 are stacked on a transparent substrate 111 successively. And, the OELD 100 according to the present invention further includes a thin passivation layer 130 deposited on the cathode layer 118 formed of a silicon based insulating material enabling to shield oxygen, moisture and the like.

Figure 3B:
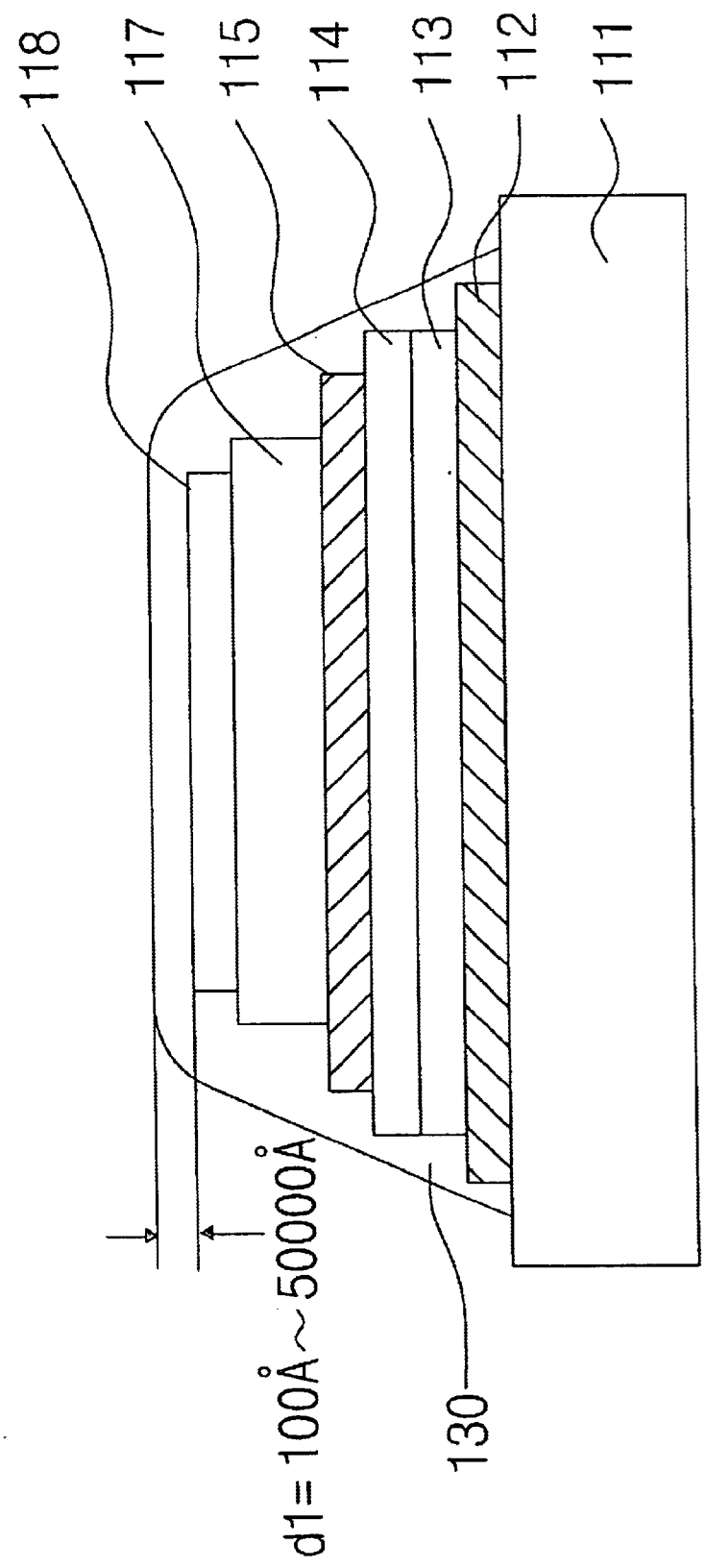
Figure 3C:
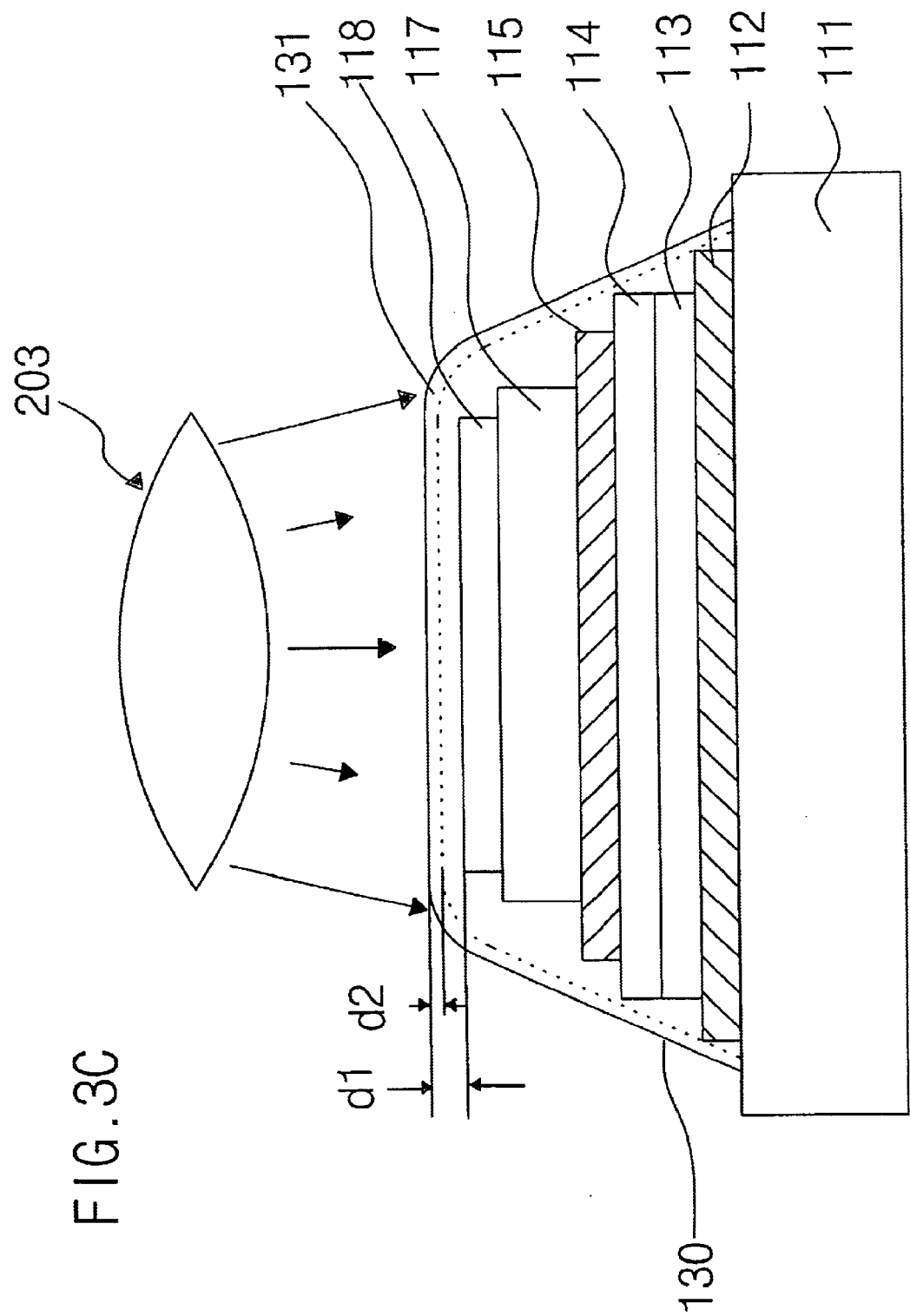

FIG. 3A to FIG. 3C illustrate cross-sectional views of fabricating an OELD according to the present invention.

Referring to FIG. 3A, a plurality of anode layers 112 are formed on a transparent substrate 111. In this case, the transparent substrate 111 is formed of one of glass, quartz glass, transparent plastic, and the like.

Preferably, the anode layer 112 is deposited by one of chemical vapor deposition, sputtering, thermal evaporation, and electron beam deposition, and is patterned by photolithography. And, the anode layer(s) is formed 100 to 10,000 Å thick, and preferably, 100 to 3,000 Å thick. A transmissivity of the anode layer 112 for visible rays is preferably close to 100%. And, at least 30% of the transmissivity is acceptable.

Preferably, the anode layer 112 is formed of one of metal, alloy, electrically conductive chemical compound and their mixtures, of which work function is at least 4.0 eV. For instance, the anode layer 112 is formed of one of ITO (indium-tin-oxide), IXO(indium-doped zinc oxide), TO(tin-oxide), Sn, Au, Pt, Pd, and their mixtures constructing a single layer or double layers.

On the anode layer 112 stacked successively as organic layers are a hole injection layer 113, a hole transport layer 114, an organic electroluminescent layer 115, and an electron transport layer 117.

When the organic layers are formed of a low molecule-based organic material, the hole injection, hole transport layer, organic electroluminescent layer, and electron transport layers 113, 114, 115, and 117 are stacked 200~600 Å, 200~600 Å, 400~500 Å, and about 600 Å thick, respectively.

The hole injection layer 113 is formed of an organic material having star-burst type molecules such as metallophthalocyanine, metal-free-phthalocyanine, 4,4',4"-tris(di-p-methylphenylamino)triphenylamine or the like. The hole injection layer 113 injects holes of the anode layer 112 into the hole transport layer 114 when an electric field is applied thereto.

The hole transport layer 114 is formed of one of organic materials such as N,N'-diphenyl-N,N'-(4-methylphenyl)-1,1'-biphenyl-4,4'-diamine, and 4,4'-bis[N-(1-naphthyl)-N-phenylamino]biphenyl. And, the hole transport layer 114 moves the injected holes to the organic electroluminescent layer 115 by the electric field.

The organic electroluminescent layer 115 is formed of the organic material such as tris(8-hydroxyquinoline)aluminum, tris(4-methyl-8-hydroxyquinoline)aluminum, 3-(2'-benzthiazolyl)-7-N,N-diethylaminocoumarine, 9,18-dihydroxybenzo[h]benzo[8]quino[2,3-b]acrydyne-7,16-dione, 4,4'-bis(2,2'-diphenyl-ethene-4-yl)-diphenyl, perylene and the like. The organic electroluminescent layer 115 generates the emission of light due to the recombination between holes moved from the hole transport layer 114 and electrons moved from the electron transport layer 117.

The electron transport layer 117 is formed of one of organic materials such as tris(8-hydroxyquinoline) aluminum, tris(8-hydroxyquinoline)gallium, 1,3-bis[5-(p-tertiary-buphylphenyl)-1,3,4-oxadiasole-2-yl]benzene and the like. And, the electron transport layer 117 moves the electrons injected from the cathode layer 118 to the organic electroluminescent layer 115 when an electric field is applied thereto.

So far, low molecule-based organic materials are explained.

In the case of an electroluminescent device using polymer (high molecule-based) materials, stacked organic layers constructed with a buffer layer such as PEDOT, PSS or the like and a luminescent layer such as poly(phenylvinylene) derivatives, PPV or the like are formed using one of spin-coating, dipping, deposition and the like. In this case, the buffer and organic electroluminescent layers are formed 200~900 Å and 200~900 Å thick, respectively, The cathode layer 118, which is formed of a metal of which work function is lower than 4.0 eV such as magnesium, aluminum, indium, lithium, sodium, silver, is constructed with a single layer, double layers, or a layer of their mixtures. And, the cathode layer 118 is formed 100 to 10,000 Å, preferably, 100 to 3,000 Å thick using sputtering, thermal evaporation, electron beam deposition, or chemical vapor deposition(CVD).

In order to increase an electron injection efficiency, LiF, CsF, $Li_2O$, Li—Al alloy or the like may be formed 1 to 100 Å thick between the cathode and electron transport layers 118 and 117.

Referring to FIG. 3B, a passivation layer 130 is deposited on the transparent substrate 111 including the cathode layer 118. The passivation layer 130 is constructed with at least one layer using selectively one of $SiO_2$, $SiO_xN_y$, $Si_3N_4$, and $SiN_x$ to a thickness d1 of 100 to 50,000 Å thick, preferably, 100 to 3,000 Å. Thus, the passivation layer 130 is formed of a silicon based insulating material enabling to shield the organic electroluminescent and cathode layers from being degraded by the penetration of oxygen, moisture and the like. The passivation layer 130 is formed or deposited by CVD, sputtering, thermal evaporation or E-beam deposition.

When the passivation layer 130 is deposited of the silicon based insulating material using CVD, a deposition temperature of layer is 25 to 300° C., inert gas is used as a carrier gas, $SiN_x$ uses $SiH_4$, $NH_3$, and $N_2$ as reaction gases, SiON uses $SiH_4$, $N_2O$, $NH_3$, and $N_2$ as reaction gases, and $SiO_2$ uses $SiH_4$ and $O_2$ as reaction gases.

When the passivation layer 130 is deposited of the silicon based insulating material using sputtering, a deposition temperature of layer is 25 to 300° C., inert gas is used as a carrier gas, and $SiN_x$, SiON, and $SiO_2$ use targets of $SiN_x$, SiON, and $SiO_2$, respectively.

Besides, a silicon based insulating inorganic material, a resin layer, and a silicon based inorganic material are successively deposited so as to form the passivation layer 130. Alternatively, the passivation layer 130 is formed by depositing a resin layer, a silicon based insulating inorganic material, and a resin layer successively.

Referring to FIG. 3C, in order to remove the defect of the passivation layer 130, heat treatment is performed. As the passivation layer 130 is not formed by a thermal growing method but deposited by CVD or sputtering, a plurality of incomplete chemical bonds between silicon and oxygen/nitrogen atoms occur. Such an incomplete bonds between atoms generates a plurality of dangling bonds and porosity, thereby bringing about the defect of the passivation layer 130. Namely, such a defect in the passivation layer provides paths through which oxygen and moisture pass. Thus, the defect should be removed therefrom through crystallization process.

A temperature of the thermal treatment to remove the defect of the passivation layer 130 deposited of the silicon based chemical compounds is 700 to 1100° C. Such a temperature is enough to affect other elements including the organic electroluminescent layer of the OELD fatally. Therefore, the present invention performs a local heat treatment process using excimer laser annealing method.

In this case, the heat treatment is performed using an excimer laser of $Ar_2$, $Kr_2$, $Xe_2$, ArF, KrF, XeCl, or $F_2$. Table 1 illustrates wavelengths of the respective excimer lasers, where annealing power of the excimer laser is 10~2000 $mJ/cm^2$, an ambient temperature is 25~300° C., and the annealing is performed for several minutes. And, an instant temperature of annealing the passivation layer 130 is a temperature enabling the crystallization. The annealing is performed out at least once.

As a result of the annealing having been performed, a high-density uniform layer 131 having a network structure consisting of silicon and oxygen(or nitrogen) is formed. In the high-density uniform layer 131, a porosity and a hydrogen content coupled with the dangling bonds are minimized. In this case, the high-density uniform layer 131 is formed to have a thickness d2 of 10 to 10,000 Å, and preferably, 100 to 2000 Å, after the annealing. Therefore, the network structure and the reduced hydrogen content prevent the organic electroluminescent and cathode layers 115 and 118 from being degraded due to the penetration of moisture and oxygen from external environments.

The species and wavelengths of the excimer lasers used for annealing the surface of the passivation layer 130 are shown in Table 1, where the annealing may be performed at least once.

TABLE 1

| Excimer laser | Wavelength |
| --- | --- |
| $Ar_2$ | 126 nm |
| $Kr_2$ | 146 nm |
| $Xe_2$ | 172 nm |
| ArF | 190 nm |
| XeF | 193 nm |
| KrF | 250 nm |
| XeCl | 350 nm |
| $F_2$ | 157 nm |

Besides, in order to prevent the degradation caused by outgassing materials generated inside the device, a metal oxide layer(not shown in the drawing) as a desiccant layer, of which desiccating and adsorbing properties are excellent, may be inserted between the cathode and passivation layers 118 and 130 using one of CaO, $Y_2O_3$, MgO and the like. The metal oxide layer is formed 100~50,000 Å thick, more preferably, 200~10,000 Å thick.

Thereafter, an external encapsulation cap may be formed over ID the transparent substrate 111 by assembly/sealing so as to cover the above-described structure using one of glass, AS resin, ABS resin, poly(propylene)(PP), poly(styrene) (HIPS), poly(methyl-meta-crylic acid) (PMMA), polycarbonate, metal and the like in order to strengthen the mechanical intensity of the passivation layer 130.

Figure 4A:
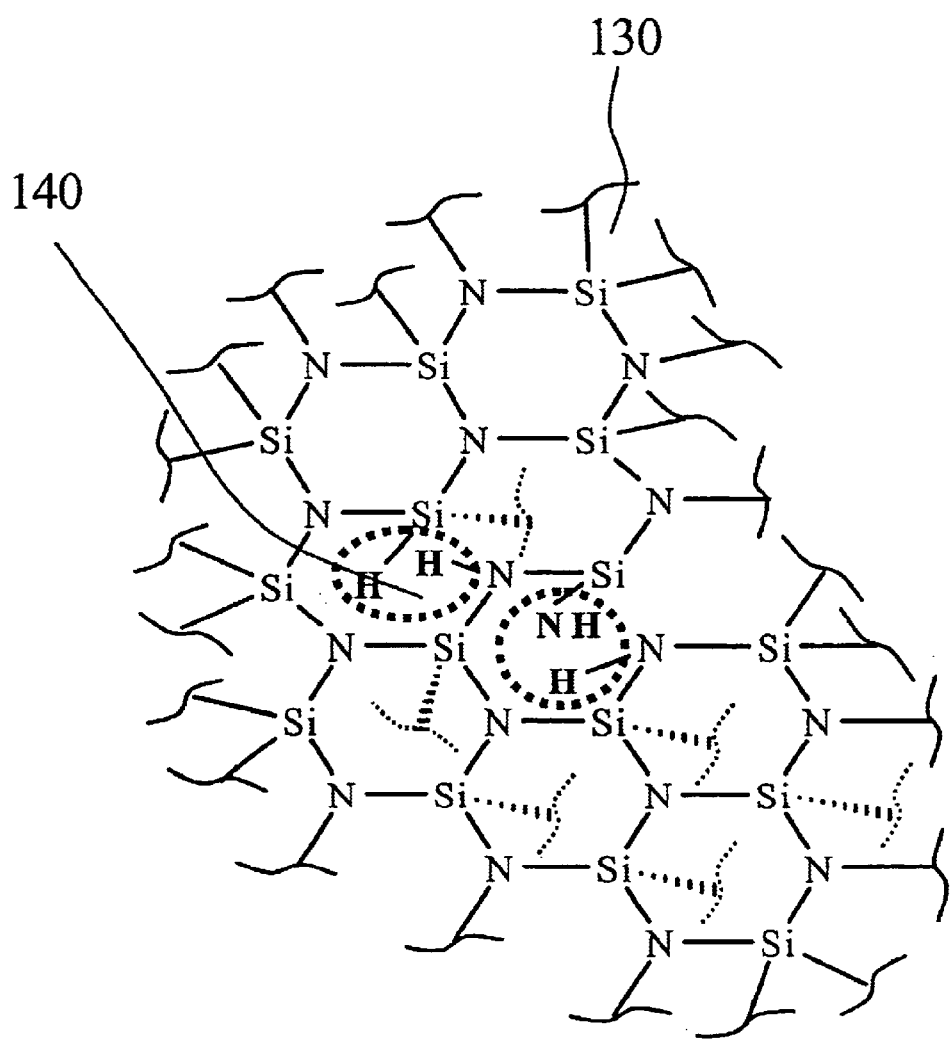
FIG. 4A and FIG. 4B illustrate network structure for chemical bonds of silicon nitride layers.
Figure 4B:
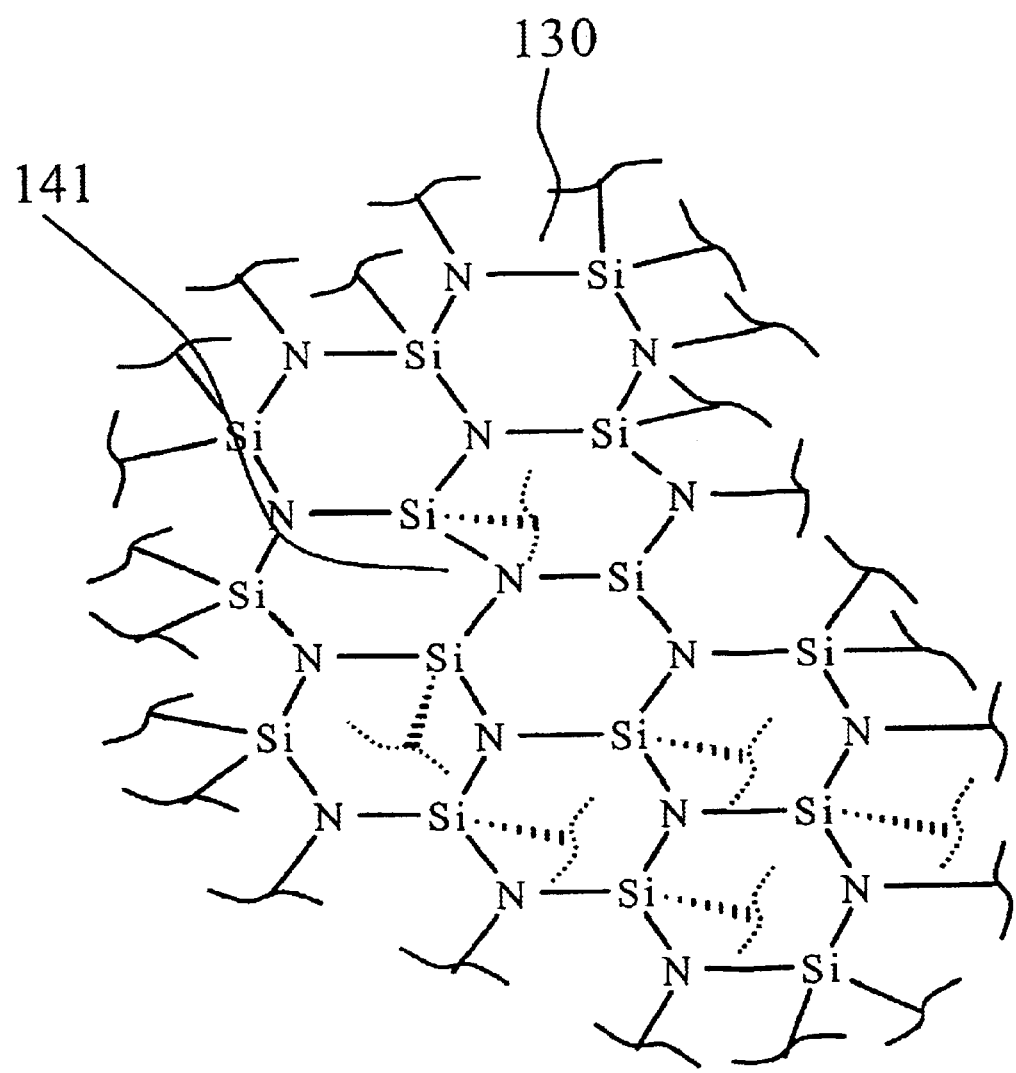

FIG. 4A and FIG. 4B illustrate network structure for chemical bonds of silicon nitride layers.

Referring to FIG. 4A, the passivation layer 130 formed of the silicon based insulating material is not formed by a thermal growing method but deposited by one of CVD, sputtering, and thermal evaporation. Thus, silicon and nitrogen atoms fail to complete their chemical bonds, thereby providing a plurality of dangling bonds 140 failing to be bonded to others. Therefore, a plurality of the dangling bonds 140 exist in the passivation layer 130 and a property of the passivation layer 130 becomes porous. Moreover, the dangling bonds 140 come into forming chemical bonds with hydrogen atoms so as to increase the hydrogen content in the passivation layer 130 as well. The dangling bonds 140 and porosity of the passivation layer cause the penetration of oxygen and moisture.

Referring to FIG. 4B, the passivation layer 130 is annealed using an excimer laser. The passivation layer 130 is abruptly crystallized so as to disconnect the chemical bonds between the dangling bonds and hydrogen atoms and form new chemical bonds 141 between silicon and nitrogen atoms. Thus, the removal of the dangling bonds 140 reduces the hydrogen content as well as minimizes the porosity of the passivation layer 130. Therefore, the uniform passivation layer 130 enabling to restrain the penetration of oxygen and moisture is attained.

Accordingly, the present invention provided with the network structure and the reduced hydrogen content enables to prevent the organic electroluminescent and cathode layers from being degraded due to the penetration of moisture and oxygen from outside by performing the excimer laser annealing locally on the passivation layer formed of silicon and nitrogen/oxygen without affecting other elements.

Moreover, considering the case of the related art requiring at least 2 to 5 hours for forming a layer enabling to exclude the external oxygen and moisture by CVD, the present invention enables to reduce a process time greatly using excimer laser annealing of which process time requires only several minutes which are relatively short.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating an organic electroluminescent display, comprising the steps of:

forming an anode layer, an organic electroluminescent layer, and a cathode layer successively on a transparent substrate;

forming a passivation layer on the transparent substrate including the cathode layer;

the passivation layer having a silicon based insulation layer; and performing heat treatment on the passivation layer locally.

2. The method of claim 1, wherein a hole injection layer and a hole transport layer are further laminated between the anode and organic electroluminescent layers.

3. The method of claim 1, wherein an electron transport layer is further laminated between the organic electroluminescent and cathode layers.

4. The method of claim 1, wherein a desiccant layer is further laminated between the cathode and passivation layers.

5. The method of claim 4, wherein the desiccant layer is formed using selectively one of CaO, $Y_2O_3$, and MgO.

6. The method of claim 1, wherein the passivation layer is formed using selectively one of $SiO_x$, $SiO_xN_y$, and $SiN_x$ to form a single layer or using selectively at least two of $SiO_x$, $SiO_xN_y$, and $SiN_x$ to form at least double layers.

7. The method of claim 1, wherein the heat treatment is carried out using eximer laser.

8. The method of claim 7, wherein an annealing power of the eximer laser is 10–2000 mJ/cm$^2$, an ambient temperature is 25–300° C., and the heat treatment is performed for several minutes.

9. The method of claim 7, wherein the eximer laser is one of lasers using $Ar_2$, $Kr_2$, $Xe_2$, ArF, KrF, XeCl, or $F_2$.

10. The method of claim 1, wherein the passivation layer is formed by stacking a first silicon based inorganic material layer, a resin layer, and a second silicon based inorganic material layer.

11. The method of claim 1, wherein the encapsulation layer is formed by stacking a first resin layer, a silicon based inorganic material layer, and a second resin layer.

12. The method of claim 1, wherein an external encapsulation cap is further formed on the passivation layer by assembly/sealing.

13. The method of claim 12, wherein the external encapsulation cap is formed using one of glass, AS resin, ABS resin, polypropylene (PP), polystyrene (HIPS), polymethyl-meta-crylic acid(PMMA), polycarbonate, and a metal.

* * * * *